(12) United States Patent
Abbasfar

(10) Patent No.: US 12,250,290 B2
(45) Date of Patent: Mar. 11, 2025

(54) SYSTEM AND METHOD FOR EFFICIENT TRANSITION ENCODING

(71) Applicant: Samsung Display Co., Ltd., Yongin (KR)

(72) Inventor: Aliazam Abbasfar, Santa Clara, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 420 days.

(21) Appl. No.: 17/701,571

(22) Filed: Mar. 22, 2022

(65) Prior Publication Data

US 2023/0254108 A1    Aug. 10, 2023

Related U.S. Application Data

(60) Provisional application No. 63/307,945, filed on Feb. 8, 2022.

(51) Int. Cl.
*H04L 7/00* (2006.01)
(52) U.S. Cl.
CPC .......... *H04L 7/0079* (2013.01); *H04L 7/0016* (2013.01)
(58) Field of Classification Search
CPC ... H04L 7/0079; H04L 4/0016; H04L 7/0016; H04L 7/033; H04L 25/4915; H04L 25/493; H04L 7/0091; H03M 5/145; H03M 99/00
See application file for complete search history.

(56) References Cited

U.S. PATENT DOCUMENTS

| | | | |
|---|---|---|---|
| 5,644,601 A | 7/1997 | Kawaguchi | |
| 5,652,749 A | 7/1997 | Davenport et al. | |
| 6,006,351 A | 12/1999 | Peretz et al. | |
| 6,300,888 B1 | 10/2001 | Chen et al. | |
| 6,381,706 B1 | 4/2002 | Zaczek | |
| 6,557,124 B1 | 4/2003 | Cideciyan et al. | |
| 6,684,363 B1 | 1/2004 | Cassiday et al. | |
| 6,909,385 B2 | 6/2005 | Vasic et al. | |
| 6,931,581 B1 | 8/2005 | Cassiday et al. | |
| 7,009,935 B2 | 3/2006 | Abrahamsson et al. | |
| 7,436,331 B1* | 10/2008 | Chaichanavong | H03M 5/145 341/94 |
| 7,440,513 B2 | 10/2008 | Thaler | |

(Continued)

FOREIGN PATENT DOCUMENTS

EP    2123053 B1    11/2009

OTHER PUBLICATIONS

European Search Report for EP Application No. 23155554.1 dated Jun. 14, 2023, 9 pages.

(Continued)

*Primary Examiner* — Charles C Jiang
*Assistant Examiner* — Margaret Marie Anderson
(74) *Attorney, Agent, or Firm* — Lewis Roca Rothgerber Christie LLP

(57) ABSTRACT

A method of transition encoding including: receiving a data packet having a packet size; identifying one or more forbidden patterns in the data packet; segmenting the data packet into a plurality of segments based on a location of the one or more forbidden patterns in the data packet; and encoding the plurality of segments by removing the one or more forbidden patterns, and appending position indicator bits according to positions of the segments in the data packet.

20 Claims, 12 Drawing Sheets

(56) References Cited

U.S. PATENT DOCUMENTS

| | | | |
|---|---|---|---|
| 7,714,749 B2* | 5/2010 | Feller | G11B 20/1426 |
| | | | 341/59 |
| 7,786,902 B1* | 8/2010 | Oberg | H03M 5/145 |
| | | | 341/51 |
| 8,781,001 B2 | 7/2014 | Sasai et al. | |
| 9,172,567 B2 | 10/2015 | Hollis | |
| 9,252,997 B1 | 2/2016 | Mishra et al. | |
| 10,263,765 B2 | 4/2019 | Muzaffar et al. | |
| 10,313,053 B2 | 6/2019 | Grant et al. | |
| 10,958,286 B2 | 3/2021 | Evans | |
| 2004/0095831 A1 | 5/2004 | Hino et al. | |
| 2015/0380050 A1 | 12/2015 | Krachkovsy et al. | |

OTHER PUBLICATIONS

Van Wijngaarden, A.J. et al. "Construction of Maximum Run-Length Limited Codes Using Sequence Replacement Techniques," IEEE Journal on Selected Areas in Communications, 28(2), Feb. 2010, pp. 200-207.

\* cited by examiner

SYSTEM AND METHOD FOR EFFICIENT TRANSITION ENCODING

CROSS-REFERENCE TO RELATED APPLICATION(S)

This application claims priority to and the benefit of U.S. Provisional Application No. 63/307,945, filed on Feb. 8, 2022, entitled "SIMPLE EFFICIENT TRANSITION ENCODING," the entire content of which is incorporated by reference herein.

BACKGROUND

1. Field

Aspects of one or more embodiments of the present disclosure relate to systems and methods for transition encoding.

2. Description of Related Art

In serial link data transmission systems, a transmitter may transmit data to a receiver serially, such that the receiver receives the data one bit at a time, sequentially, over a communication channel or bus. In this case, the transmitter may embed a local clock signal along with the data into a data stream, such that a separate clock signal may not be transmitted. Accordingly, the receiver may recover the embedded clock signal from the data stream, such that the receiver may appropriately sample the data from the data stream. Such clock recovery may be based on transitions (e.g., bit transitions) in the data stream, so that no transitions may correspond to no updates.

The above information disclosed in this Background section is for enhancement of understanding of the background of the present disclosure, and therefore, it may contain information that does not constitute prior art.

SUMMARY

One or more embodiments of the present disclosure are directed to systems and methods for transition encoding, and more particularly, to systems and methods for guaranteed transition encoding in embedded-clock serial links.

According to one or more embodiments of the present disclosure, a method of transition encoding includes: receiving a data packet having a packet size; identifying one or more forbidden patterns in the data packet; segmenting the data packet into a plurality of segments based on a location of the one or more forbidden patterns in the data packet; and encoding the plurality of segments by removing the one or more forbidden patterns, and appending position indicator bits according to positions of the segments in the data packet.

In an embodiment, a forbidden pattern may be a sequence of bits in the data packet that have the same value as each other.

In an embodiment, a number of bits in the sequence of bits may be equal to a number of bits defined by a limited run-length plus one bit.

In an embodiment, the segmenting of the data packet may include dividing the data packet into at least a first segment and a second segment according to a location of a last bit of a first forbidden pattern from among the one or more forbidden patterns in the data packet, the first segment including at least all of the bits of the first forbidden pattern.

In an embodiment, the encoding of the plurality of segments may include: removing all of the bits of the first forbidden pattern from the first segment; and appending the position indicator bits having the same number of bits as that of the removed bits of the first forbidden pattern.

In an embodiment, the position indicator bits may include one non-last segment indicator bit, an N-bit sequence size indicator number, one sequence start indicator bit, and one sequence end indicator bit, where N is equal to a number of the removed bits of the first forbidden pattern minus 3.

In an embodiment, the first segment may begin with the first forbidden pattern and may be equal to the first forbidden pattern, and the encoding of the plurality of segments may further include: setting each bit of the N-bit sequence size indicator number to null; setting the one sequence start indicator bit to an invert of a value of a removed bit of the first forbidden pattern; setting the one sequence end indicator bit to the value of the removed bit; and arranging the one sequence end indicator bit to be adjacent to the one sequence start indicator bit in the encoded first segment.

In an embodiment, the first segment may further include a first data sequence, and the encoding of the plurality of segments may further include: counting a number of bits of the first data sequence; setting the N-bit sequence size indicator number to the number count; setting the one sequence start indicator bit to an invert of a value of a first bit of the first data sequence; setting the one sequence end indicator bit to an invert of a value of a last bit of the first data sequence; and adding the first data sequence between the one sequence start indicator bit and the one sequence end indicator bit in the encoded first segment.

In an embodiment, the second segment may be a last segment having no forbidden patterns and no data sequence, and the encoding of the plurality of segments may include: adding two position indicator bits to the second segment to encode the second segment, the two position indicator bits including one last segment indicator bit and one sequence end indicator bit; setting the one sequence end indicator bit based on an invert of the one last segment indicator bit; and arranging the one sequence end indicator bit to be adjacent to the last segment indicator bit in the encoded second segment.

In an embodiment, the second segment may be a last segment having a second data sequence and no forbidden patterns, and the encoding of the plurality of segments may include: adding two position indicator bits to the second segment to encode the second segment, the two position indicator bits including one last segment indicator bit and one sequence end indicator bit; setting the one sequence end indicator bit based on an invert of a last bit of the second data sequence; and arranging the second data sequence between the one last segment indicator bit and the one sequence end indicator bit in the encoded second segment.

According to one or more embodiments of the present disclosure, a data transmission system includes: a communication link; and a transmitter communicably connected to the communication link, the transmitter including an encoder configured to: receive a data packet having a packet size; identify one or more forbidden patterns in the data packet; segment the data packet into a plurality of segments based on a location of the one or more forbidden patterns in the data packet; encode the plurality of segments by removing the one or more forbidden patterns, and appending position indicator bits according to positions of the segments in the data packet; and transmit the encoded segments over the communication link.

In an embodiment, the plurality of segments may include at least a first segment and a second segment divided according to a location of a last bit of a first forbidden pattern from among the one or more forbidden patterns in the data packet, the first segment including at least all of the bits of the first forbidden pattern.

In an embodiment, to encode the plurality of segments, the encoder may be further configured to: remove all of the bits of the first forbidden pattern from the first segment; and append the position indicator bits having the same number of bits as that of the removed bits of the first forbidden pattern.

In an embodiment, the position indicator bits may include one non-last segment indicator bit, an N-bit sequence size indicator number, one sequence start indicator bit, and one sequence end indicator bit, where N may be equal to a number of the removed bits of the first forbidden pattern minus 3.

In an embodiment, the first segment may begin with the first forbidden pattern and may be equal to the first forbidden pattern, and to encode the plurality of segments, the encoder may be further configured to: set each bit of the N-bit sequence size indicator number to null; set the one sequence start indicator bit to an invert of a value of a removed bit of the first forbidden pattern; set the one sequence end indicator bit to the value of the removed bit; and arrange the one sequence end indicator bit to be adjacent to the one sequence start indicator bit in the encoded first segment.

In an embodiment, the first segment may further include a first data sequence, and to encode the plurality of segments, the encoder may be further configured to: count a number of bits of the first data sequence; set the N-bit sequence size indicator number to the number count; set the one sequence start indicator bit to an invert of a value of a first bit of the first data sequence; set the one sequence end indicator bit to an invert of a value of a last bit of the first data sequence; and add the first data sequence between the one sequence start indicator bit and the one sequence end indicator bit in the encoded first segment.

In an embodiment, the second segment may be a last segment having no forbidden patterns and no data sequence, and to encode the plurality of segments, the encoder may be further configured to: add two position indicator bits to the second segment to encode the second segment, the two position indicator bits comprising one last segment indicator bit and one sequence end indicator bit; set the one sequence end indicator bit based on an invert of the one last segment indicator bit; and arrange the one sequence end indicator bit to be adjacent to the last segment indicator bit in the encoded second segment.

In an embodiment, the second segment may be a last segment having a second data sequence and no forbidden patterns, and to encode the plurality of segments, the encoder may be further configured to: add two position indicator bits to the second segment to encode the second segment, the two position indicator bits including one last segment indicator bit and one sequence end indicator bit; set the one sequence end indicator bit based on an invert of a last bit of the second data sequence; and arrange the second data sequence between the one last segment indicator bit and the one sequence end indicator bit in the encoded second segment.

In an embodiment, the system may further include a receiver communicably connected to the communication link, the receiver including a decoder configured to: receive a first bit of an encoded segment of the data packet over the communication link, the first bit corresponding to a non-last segment indicator bit of the encoded segment; determine that a bit value of the first bit indicates that the encoded segment is not a last segment of the data packet; receive a last bit of the encoded segment over the communication link, the last bit corresponding to a sequence end indicator bit of the encoded segment; determine a bit value of the last bit; and decode the encoded segment by appending a number of sequential bits having the same value as that of the last bit of the encoded segment, the number of sequential bits being equal to a number of bits defined by a limited run-length plus one bit.

According to one or more embodiments of the present disclosure, a method for decoding includes: receiving a first bit of an encoded segment of a data packet, the first bit corresponding to a non-last segment indicator bit of the encoded segment; determining that a bit value of the first bit indicates that the encoded segment is not a last segment of the data packet; receiving a last bit of the encoded segment, the last bit corresponding to a sequence end indicator bit of the encoded segment; determining a bit value of the last bit; and decoding the encoded segment by appending a number of sequential bits having the same value as that of the last bit of the encoded segment, the number of sequential bits being equal to a number of bits defined by a limited run-length plus one bit.

BRIEF DESCRIPTION OF THE DRAWINGS

The above and other aspects and features of the present disclosure will be more clearly understood from the following detailed description of the illustrative, non-limiting embodiments with reference to the accompanying drawings.

DETAILED DESCRIPTION

Figure 1:
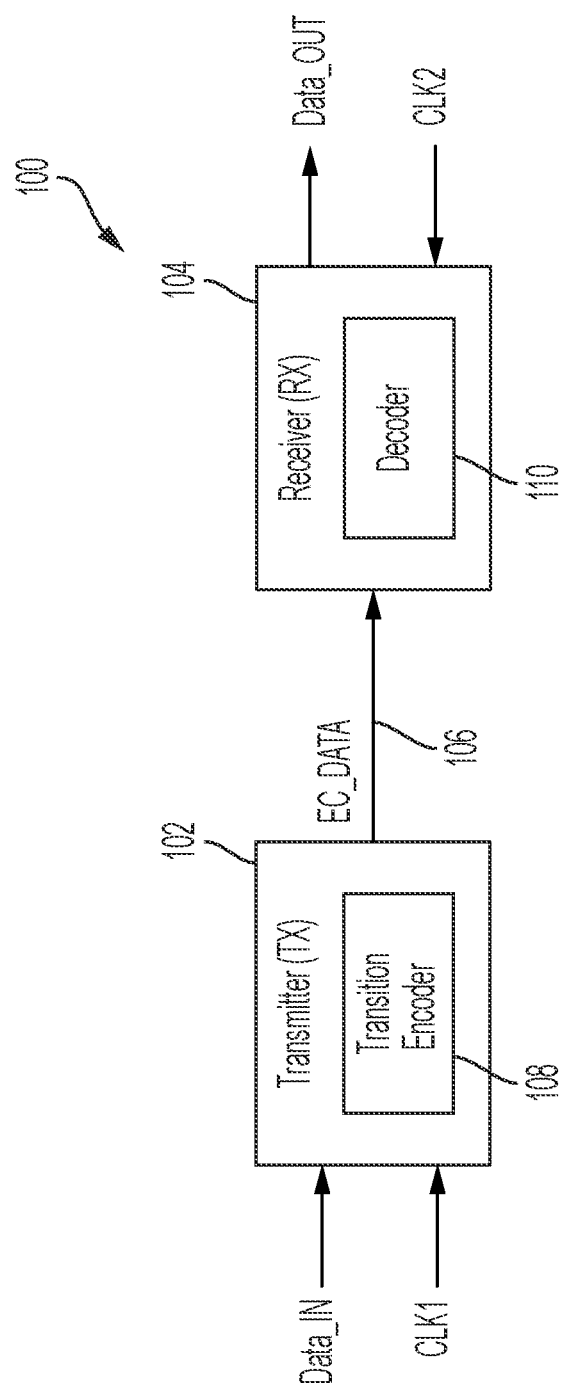
FIG. 1 is a system diagram of a data transmission system according to one or more embodiments of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Typically, when transmitting an embedded-clock data stream over a serial link (e.g., a communication channel or bus), the encoded data may include an increased number of bits when compared to the original data. The increased number of bits may be referred to as overhead bits, and may contain information that is used by a receiver to appropriately sample the data bits from the encoded data. When the number of overhead bits in the encoded data is increased, or in other words, when the overhead of the encoded data is increased, a transmission rate of the data may be reduced, as more bits may be transmitted over the serial link. Further, as the receiver may receive and process more bits in order to sample the data bits from the encoded packet, latency may be increased.

According to one or more embodiments of the present disclosure, however, systems and methods for efficient guaranteed transition encoding may be provided, such that the overhead of an encoded data packet may be reduced, while including appropriate transitions in the encoded data packet such that the receiver may suitably sample a data sequence from the encoded data packet. Accordingly, the number of overhead bits that the receiver may process in order to sample the data bits may be reduced, data transmission rates may be improved, and/or latency may be reduced. These and/or other aspects and features of the present disclosure will be described in more detail hereinafter with reference to the figures.

Figure 2:
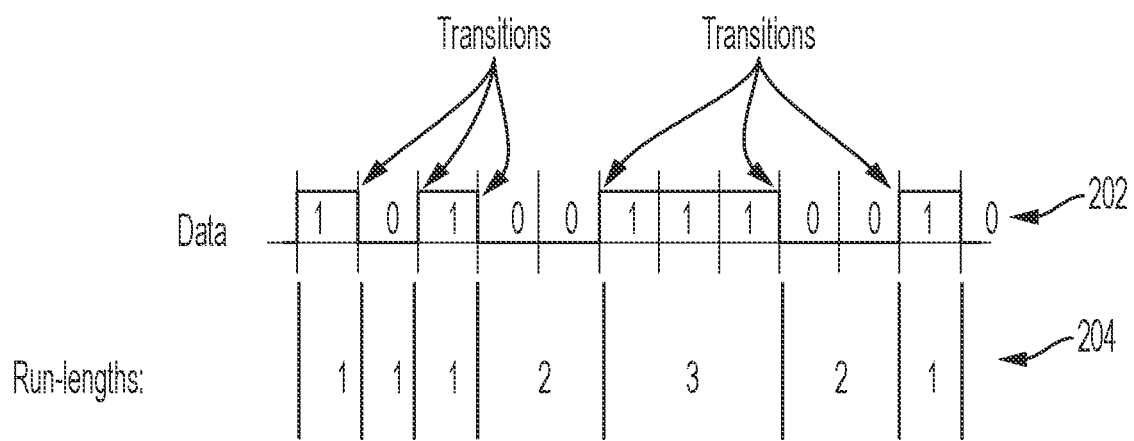
FIG. 2 is a schematic diagram illustrating bit-transitions in a data packet according to one or more embodiments of the present disclosure.

FIG. 1 is a system diagram of a data transmission system according to one or more embodiments of the present disclosure. FIG. 2 is a schematic diagram illustrating bit-transitions in a data packet according to one or more embodiments of the present disclosure. FIG. 2 shows a relationship between bit-transitions in a data packet 202 and run-lengths 204 thereof.

Referring to FIG. 1, in some embodiments, a data transmission system 100 may include a transmitter 102 connected to a receiver 104 over a communication channel or bus 106. The transmitter 102 and the receiver 104 may be implemented as different electronic devices or as part of different systems from each other, or may be implemented as different electronic components of the same electronic device or system as each other.

The communication channel or bus 106 may be a serial link that facilitates communications (e.g., using a connector and protocol) between the transmitter 102 and the receiver 104, but the present disclosure is not limited thereto, and the communication channel or bus 106 may be a parallel link in some embodiments. For example, the communication channel or bus 106 (e.g., the connector and protocol thereof) may include (or may conform to) Peripheral Component Interconnect Express (PCIe), remote direct memory access (RDMA) over Ethernet, Serial Advanced Technology Attachment (SATA), Serial Attached SCSI (SAS), and/or the like. In other embodiments, the communication channel or bus 106 (e.g., the connector and the protocol thereof) may include (or may conform to) various general-purpose interfaces, for example, such as Ethernet, Universal Serial Bus (USB), and/or the like.

The communication channel or bus 106 may directly connect the transmitter 102 and the receiver 104 to each other (e.g., via a data bus, cable, and/or the like), or may connect the transmitter 102 and the receiver 104 to each other over a suitable wired or wireless network (e.g., a Local Area Network (LAN), a Wide Area Network (WAN), the Internet, a cellular communications network, and/or the like). For example, the communication channel or bus 106 may include a Wi-Fi transceiver for communicating via a wireless communications network. In another example, the communication channel or bus 106 may include an Ethernet card and port for sending and receiving data via an Ethernet-based communications link or network. In another example, the communication channel or bus 106 may include cellular or mobile phone communications transceivers. In various embodiments, the communication channel or bus 106 may support various protocols (e.g., TCP/IP, User Datagram Protocol UDP, Hypertext Transfer Protocol HTTP, Internet Message Access Protocol IMAP, Simple Mail Transfer Protocol SMTP, and/or the like) and/or data communication interfaces (e.g., Application Program Interface API, Web Services, and/or the like) for facilitating data communications between the transmitter 102 and the receiver 104.

The transmitter 102 may be implemented as any suitable electronic device or may be implemented as part of any suitable electronic device or system that encodes and transmits serial data over the communication channel or bus 106. For example, the transmitter 102 may include one or more controllers (e.g., integrated circuits) and/or processors, transistors, logic gates, registers, memory devices, and/or the like. The transmitter 102 may include a transition encoder 108 to encode a data packet Data_IN (e.g., received from a host device or processor) according to a local clock signal (e.g., a first clock signal) CLK1. The transmitter 102 may transmit an encoded data packet EC_DATA having guaranteed transitions to the receiver 104 over the communication channel or bus 106.

For example, in some embodiments, the transition encoder 108 may perform digital to analog (D to A) conversion, such that the transition encoder 108 may operate using the first clock signal CLK1. In another embodiment, the transition encoder 108 may simply introduce transitions into digital data, in which case the transmitter 102 may include separate D to A circuitry to generate a data signal representing the encoded data packet generated by the transition encoder 108 based on the first clock signal CLK1. In any case, the transition encoder 108 may introduce guaranteed transitions in the encoded data packet, such that the receiver 104 may suitably sample a data sequence from the encoded data packet according to the transitions.

The receiver 104 may be implemented as any suitable electronic device or may be implemented as part of any suitable electronic device or system that receives the encoded data over the communication channel or bus 106, and decodes the encoded data based on the transitions in the encoded data. For example, the receiver 104 may include one or more controllers (e.g., integrated circuits) and/or processors, transistors, logic gates, registers, memory devices, and/or the like. The receiver 104 may include a decoder 110 to decode the encoded data packet EC_DATA received over the communication channel or bus 106 according to the transitions encoded in the encoded data packet EC_DATA. For example, the receiver 104 may recover an embedded clock signal from the encoded data packet EC_DATA to synchronize its own local clock signal (e.g., a second clock signal) CLK2, and may sample data sequences contained in the encoded data packet EC_DATA according to the transitions encoded in the encoded data packet EC_DATA. The receiver may output the decoded data as a data packet Data_OUT corresponding to the original data packet Data_IN.

For example, in some embodiments, the decoder 110 may include a clock and data recovery (CDR) circuit to perform analog to digital (A to D) conversion, and to recover the second clock signal CLK2 according to the transitions in the encoded data packet EC_DATA. In another embodiment, the receiver may include a separate circuit for the A to D conversion that may include the CDR circuit to extract the second clock signal CLK2, and a sampling circuit to generate the digital data based on the second clock signal CLK2 and the data signal. In any case, the decoder 110 may decode the encoded data packet EC_DATA according to the transitions contained therein, such that the receiver 104 may output the data packet Data_OUT by sampling the data sequence according to the transitions.

For example, as shown in FIG. 2, in some embodiments, clock recovery may be based on bit-transitions of bit values (e.g., ones and zeros) in a data packet 202, such that no transitions may mean no updates. Accordingly, in some embodiments, a no-transition run-length may be limited to enable the receiver 104 (e.g., the decoder 110) to recover the embedded clock. For example, a run length 204 may be limited to K bits, such that a transition is expected to occur at least once every K bits.

Thus, some run-length limited (RLL) codes may guarantee transitions every K bits to generate the encoded data stream as serialized data bits. As an example, a comparative transition encoding method may consider K-bit words. Such comparative transition encoding method may encode each of the words by inserting one extra bit after each word with a value equal to an invert of the last bit of the word. Accordingly, such addition of extra bits in the encoded data packet results in a size of the encoded data packet being increased, which may be a large overhead. For example, for a word size of 10 bits, the increase of the encoded data packet results in an overhead of about 10% (e.g., 1/10). As the overhead increases, transmission rates thereof may be decreased, and latency may be increased.

According to one or more embodiments of the present disclosure, the transmitter 102 (e.g., the encoder 108) may segment the data packet into a plurality of segments based on locations of one or more forbidden patterns in the data packet. Each of the segments that is not the last segment of the data packet may include a forbidden pattern, and the last segment may not include a forbidden pattern. The forbidden patterns may be replaced with the same number of position indicator bits in the encoded segments, and thus, no overhead bits may be introduced in the encoded segments that have the forbidden patterns. The last segment may be encoded with two (2) overhead bits corresponding to position indicator bits for the last segment, and thus, the encoded last segment may include two (2) overhead bits. Accordingly, irrespective of a size of the data packet, a size of a data sequence contained therein, or a size of a limited run length, only two (2) overhead bits may be introduced in the encoded packet. Accordingly, overhead may be minimized or reduced, and transmission rates may be improved.

Still referring to FIG. 1, each of the encoder 108 and the decoder 110 may be implemented utilizing any suitable hardware, firmware (e.g. a field programmable gate array (FPGA), an application-specific integrated circuit (ASIC), and/or the like), software, or a combination of software, firmware, and hardware. For example, each of the encoder 108 and the decoder 110 may be formed on one or more integrated circuit (IC) chips, or may be a process or thread running on one or more processors executing computer program instructions stored in memory. The one or more processors may be implemented with a general-purpose processor, an Application Specific Integrated Circuit (ASIC), one or more Field Programmable Gate Arrays (FPGAs), a Digital Signal Processor (DSP), a group of processing components, or other suitable electronic processing components. The memory may include tangible, non-transient, volatile memory or non-volatile memory, such as Random Access Memory (RAM), Read-Only Memory (ROM), Non-volatile RAM (NVRAM), Flash Memory, hard disk storage, cloud storage, and/or other suitable electronic storage devices.

Figure 3:
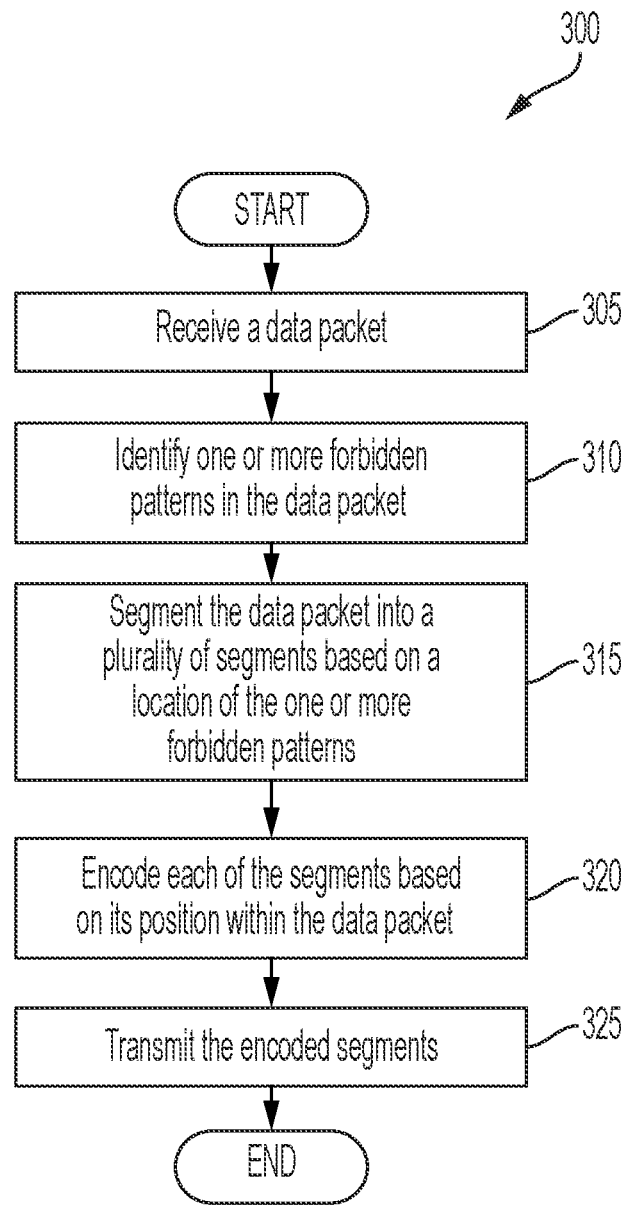
FIG. 3 is a flow diagram of a method for transition encoding according to one or more embodiments of the present disclosure.
Figure 4A:
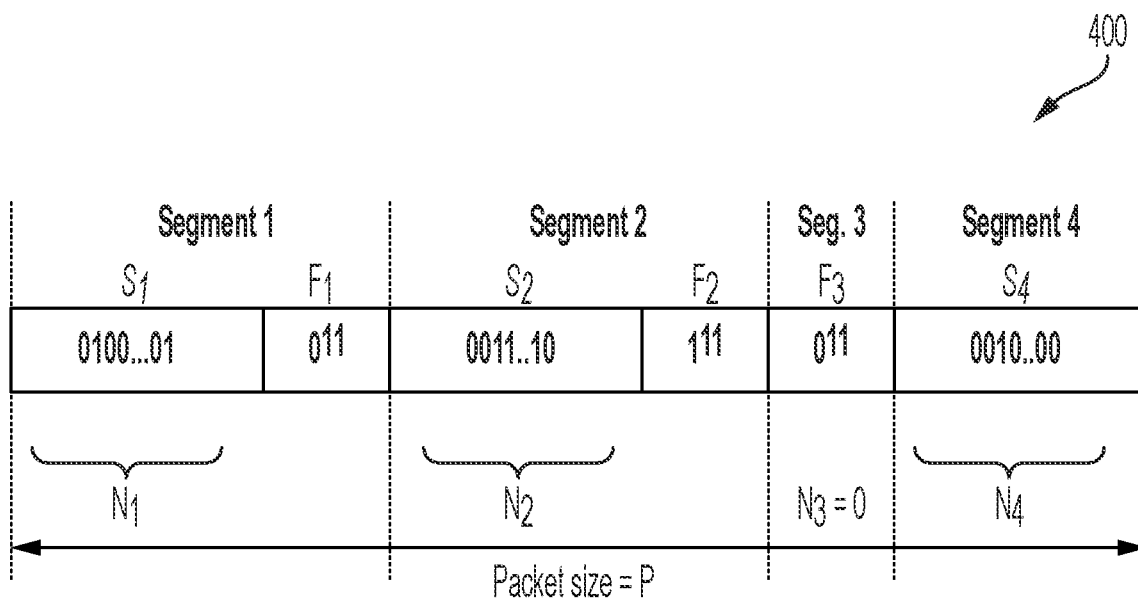
FIG. 4A is a schematic diagram of a data packet segmented into a plurality of segments according to one or more embodiments of the present disclosure.
Figure 4B:
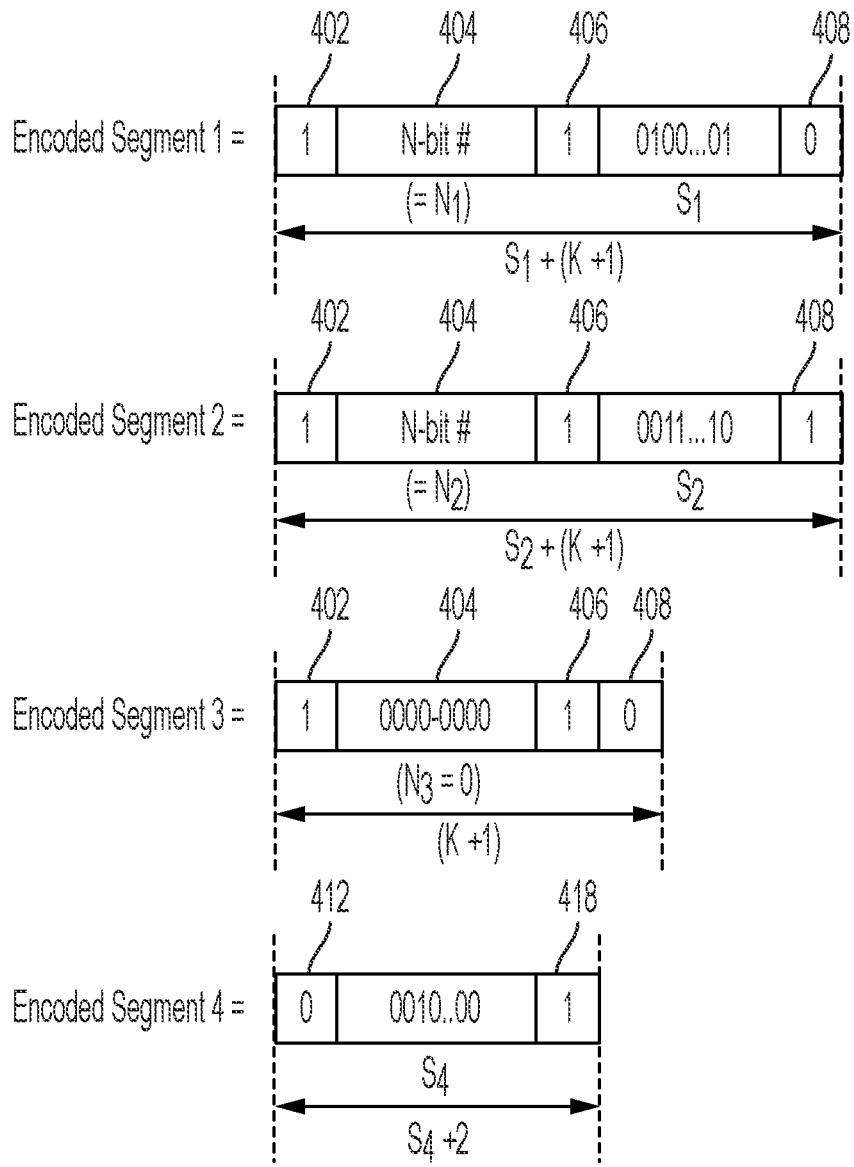
FIG. 4B is a schematic diagram of encoded segments of a data packet according to one or more embodiments of the present disclosure.

FIG. 3 is a flow diagram of a method for transition encoding according to one or more embodiments of the present disclosure. FIG. 4A is a schematic diagram of a data packet segmented into a plurality of segments according to one or more embodiments of the present disclosure. FIG. 4B is a schematic diagram of encoded segments of a data packet according to one or more embodiments of the present disclosure.

For example, the method 300 may be performed by the encoder 108 shown in FIG. 1. However, the present disclosure is not limited thereto, and the operations shown in the method 300 may be performed by any suitable one of the components and elements or any suitable combination of the components and elements of those of one or more example embodiments described above. Further, the present disclosure is not limited to the sequence or number of the operations of the method 300 shown in FIG. 3, and can be altered into any desired sequence or number of operations as recognized by a person having ordinary skill in the art. For example, in some embodiments, the order may vary, or the method 300 may include fewer or additional operations.

Referring to FIGS. 3 and 4A, the method 300 may start, and a data packet 400 may be received at block 305. For example, the data packet 400 may be received from a host device (e.g., a host processor), and may have a packet size (e.g., a fixed packet size) P. As shown in FIG. 4A, the data packet 400 may include one or more data sequences $S_1$, $S_2$, and $S_4$, and one or more forbidden patterns $F_1$, $F_2$, and $F_3$ contained therein. However, the present disclosure is not limited thereto, and it should be appreciated that in practice, a received data packet may have zero to any suitable number of forbidden patterns contained therein.

One or more forbidden patterns $F_1$, $F_2$, and $F_3$ in the data packet 400 may be identified at block 310. For example, the non-limiting example shown in FIG. 4A assumes that a limited run length K is 10 bits. Accordingly, the forbidden patterns $F_1$, $F_2$, and $F_3$ are shown as a number (e.g., K+1) of sequential bits in the data packet 400 having the same value as each other, which violates the limited run length K of 10 bits. For example, a first forbidden pattern $F_1$ is shown in short hand (e.g., $0^{11}$) as having K+1 (e.g., 11) sequential bits all having the same value of zero (0), a second forbidden pattern $F_2$ is shown in short hand (e.g., $1^{11}$) as having K+1 (e.g., 11) sequential bits all having the same value of one (1), and a third forbidden pattern $F_3$ is shown in the short hand (e.g., $0^{11}$) as having K+1 (e.g., 11) sequential bits all having the same value of zero (0). Thus, in the example of the data packet 400 shown in FIG. 4A, any sequential 11 bits (e.g., K+1) in the data packet 400 that have the same value as each other (e.g., one or zero) may be identified as a forbidden pattern.

The data packet 400 may be segmented into a plurality of segments Segment 1, Segment 2, Segment 3, and Segment 4 based on a location of the one or more forbidden patterns $F_1$, $F_2$, and $F_3$ at block 315. For example, in some embodiments, as shown in FIG. 4A, the transmitter 102 (e.g., the encoder 108) may segment the data packet 400 based on a location of a last bit of each of the forbidden patterns $F_1$, $F_2$, and $F_3$.

In this case, as shown in the non-limiting example of FIG. 4A, the data packet 400 may be segmented into a first segment Segment 1 based on a location of a last bit of the first forbidden pattern $F_1$, a second segment Segment 2 based on a location of a last bit of the second forbidden pattern $F_2$, and a third segment Segment 3 based on a location of a last bit of the third forbidden pattern $F_3$. In this example, as the first bit of the first forbidden pattern $F_1$ follows right after a last bit of a first data sequence $S_1$, the first segment Segment 1 may include the first data sequence $S_1$ and the first forbidden pattern $F_1$. Similarly, as the first bit of the second forbidden pattern $F_2$ follows right after a last bit of the second data sequence $S_2$, the second segment Segment 2 may include the second data sequence $S_2$ and the second forbidden pattern $F_2$. On the other hand, as the first bit of the third forbidden pattern $F_3$ follows right after the last bit of the second forbidden pattern $F_2$, the third segment Segment 3 may include the third forbidden pattern $F_3$ without any data sequence therein. In other words, the third segment Segment 3 may begin with the third forbidden pattern $F_3$, and may be equal to the third forbidden pattern $F_3$.

A last segment may be a segment that follows a last bit of a last forbidden pattern contained in the data packet 400. Accordingly, the last segment may be a segment that contains only a data sequence, if any, or may be an empty segment (e.g., a segment that contains no data sequence and no forbidden patterns). Thus, returning to the non-limiting example shown in FIG. 4A, as the third forbidden pattern $F_3$ is shown as being the last forbidden pattern of the data packet 400, the data packet 400 may be further segmented into a fourth segment Segment 4 as the last segment following the last bit of the third forbidden pattern $F_3$ (e.g., the last forbidden pattern).

In the non-limiting example shown in FIG. 4A, a first bit of the fourth data sequence $S_4$ follows right after the last bit of the third forbidden pattern $F_3$ (e.g., the last forbidden pattern), and thus, the fourth segment Segment 4 (e.g., the last segment) is shown as including the fourth data sequence $S_4$ without any forbidden patterns. However, the present disclosure is not limited thereto, and as discussed above, the last segment (e.g., the fourth segment Segment 4) may be an empty segment, for example, if no data sequence follows the last forbidden pattern. For example, if the data packet 400 ended with the third forbidden pattern $F_3$, the fourth segment Segment 4 may be provided as the last segment having no data sequence and no forbidden patterns. In other words, even a data packet including only one forbidden pattern may still be segmented into at least two segments according to the last bit of the one forbidden pattern, and thus, the last of the two segments thereof may be an empty segment or a segment including only a data sequence.

For convenience of distinguishing purposes, segments that are not the last segment (e.g., the first to third segments Segment 1 to Segment 3) of a data packet may be referred to as a non-last segment, and a last segment (e.g., Segment 4) of the data packet may be referred to as the last segment. While FIG. 4A shows four segments Segment 1, Segment 2, Segment 3, and Segment 4, the present disclosure is not limited thereto, and a data packet may be segmented into any suitable number of segments based on a number and location of the forbidden patterns contained therein, if any.

Each of the data sequences $S_1$, $S_2$, and $S_4$ may have any suitable length (e.g., may each have any suitable number of bits), and the length of each of the data sequences $S_1$, $S_2$, and $S_4$ may not be fixed (e.g., may not be known ahead of time), as the lengths thereof may depend on a location of the forbidden patterns $F_1$, $F_2$, and $F_3$ contained in the data packet 400. Thus, in FIG. 4A, a length (e.g., a bit-length) of a corresponding data sequence $S_1$, $S_2$, and $S_4$ contained in a segment, if any, is represented by a size number $N_1$, $N_2$, $N_3$, and $N_4$, such that for the third segment Segment 3 having no data sequence, the size number $N_3$ thereof may correspond to zero (0). However, the total number of bits (e.g., including the bits of the forbidden patterns $F_1$, $F_2$, and $F_3$ and the bits of the data sequences $S_1$, $S_2$, and $S_4$) of the data packet 400 may be limited by the packet size P of the data packet 400.

Each of the segments may be encoded based on its position within the data packet 400 at block 320. For example, as discussed in more detail below, each of the segments Segment 1 through Segment 4 may be encoded based on whether or not the corresponding segment is a last segment. In this case, as each of the non-last segments (e.g., Segment 1 through Segment 3) includes a forbidden pattern (e.g., $F_1$, $F_2$, and $F_3$), each of the non-last segments may be encoded in the encoded data packet by replacing the bits of the forbidden pattern contained therein with the same number of position indicator bits. On the other hand, as the last segment (e.g., Segment 4) does not include a forbidden pattern, the last segment may be encoded by adding two position indicator bits as overhead bits to inform the receiver to process the segment as the last segment of the data packet 400. Thus, the overhead added to the encoded data packet may be 2-bits, regardless of any given limited run length K.

For example, as shown in FIG. 4B, each of the non-last segments (e.g., Segment 1 through Segment 3) may be encoded to include the same number (e.g., K+1) of non-last position indicator bits as those of the removed forbidden pattern bits, plus the data sequence bits contained therein, if any. The non-last position indicator bits may include, for example, one bit corresponding to a non-last segment indicator bit 402, N-bits corresponding to a sequence size indicator number 404, one bit corresponding to a sequence start indicator bit 406, and one bit corresponding to a sequence end indicator bit 408. A bit size (e.g., N) of the N-bit sequence size indicator number 404 may correspond to the number of bits (e.g., K+1) of the removed forbidden pattern, minus one bit for each of the non-last segment indicator bit 402, the sequence start indicator bit 406, and the sequence end indicator bit 408 (e.g., (K+1)−3). Thus, when the limited run-length K is equal to 10, the forbidden patterns have a size equal to 11 bits (e.g., K+1), and the N-bit sequence size indicator number 404 may be an 8-bit (e.g., (K+1)−3) number that corresponds to the sequence size (e.g., $N_1$, $N_2$, and $N_3$) of a corresponding data sequence (e.g., $S_1$ and $S_2$), if any, contained in a corresponding non-last segment (e.g., Segment 1 or Segment 2). When the non-last segment (e.g., Segment 3) does not include a data sequence, then the N-bit sequence size indicator number 404 thereof may be N-bits (e.g., 8-bits) equal to 0 or set to null (e.g., 0000-0000).

The non-last segment indicator bit 402 may enable the receiver to identify whether or not a corresponding encoded segment is a last segment. For example, as shown in FIG. 4B, in some embodiments, when the non-last segment indicator bit 402 is set to true (e.g., a value of one (1)), the receiver may identify the corresponding encoded segment as not being the last segment. On the other hand, when the non-last segment indicator bit 402 is set to false (e.g., a value of zero (0)), which may also be referred to as a last segment indicator bit 412 being set to true (e.g., a value of zero (0)), the receiver may identify the corresponding encoded segment as being the last segment. Thus, the non-last segment indicator bit 402 (or the last segment indicator bit 412) may inform (e.g., may signal) the receiver when a last segment of the encoded data packet is being transmitted, such that the receiver may decode the last segment differently from the non-last segments. For example, as discussed above, because each of the non-last segments may include at least one forbidden pattern therein, and the last segment may not include a forbidden pattern therein, the non-last segment indicator bit 402 may inform the receiver that a forbidden pattern may need to be further appended to the end of the corresponding non-last segment.

As discussed above, the N-bit sequence size indicator number 404 may be an N-bit number corresponding to a bit size of any data sequence contained in the corresponding encoded non-last segment. Thus, the N-bit sequence size indicator number 404 may be used by the receiver to identify a bit size of a data sequence, if any, contained in the corresponding encoded non-last segment, such that the receiver may appropriately sample the data sequence from the encoded non-last segment, if any. As discussed above, when the segment (e.g., Segment 3) does not include any data sequence therein, each of the N-bits of the N-bit sequence size indicator number 404 for the segment may be set to null (e.g., 0000-0000), which may inform the receiver that there are zero (0) bits of a data sequence contained in the corresponding encoded non-last segment.

The sequence start indicator bit 406 and the sequence end indicator bit 408 may inform the receiver of the start and end, respectively, of any data sequence contained in a non-last segment. In some embodiments, the sequence start indicator bit may provide a guaranteed transition at the beginning of a data sequence, if any, and the sequence end indicator bit may provide a guaranteed transition at the end of the data sequence, if any. For example, the sequence start indicator bit 406 may be set as an invert of a first bit of the data sequence contained in the non-last segment, if any, and the sequence end indicator bit 408 may be set as an invert of a last bit of the data sequence contained in the non-last segment, if any. When the non-last segment does not contain any data sequences therein, the sequence start indicator bit 406 may be set according to an invert of a bit value of the forbidden pattern contained in the non-last segment, and the sequence end indicator bit 408 may be set as the same value as the bit value of the forbidden pattern contained in the non-last segment. The sequence end indicator bit 408 may also inform the receiver to add a forbidden pattern at the end of the non-last segment, such that the receiver may add a suitable number (e.g., K+1) of sequentially repeating zeros (0) or ones (1) at the end of the non-last segment based on (e.g., by repeating) the value (e.g., the same value) of the sequence end indicator bit 408.

As shown in FIG. 4B, in response to a corresponding non-last segment (e.g., Segment 1 or Segment 2) including a data sequence (e.g., the first sequence $S_1$ or the second sequence $S_2$), the transmitter (e.g., the encoder) may append the corresponding data sequence (e.g., the bits of the first sequence $S_1$ or the second sequence $S_2$) between the corresponding sequence start indicator bit 406 and the corresponding sequence end indicator bit 408 of the corresponding non-last segment. Thus, the receiver may use the N-bit sequence size indicator number 404 for the corresponding non-last segment to determine the number of bits of a corresponding data sequence between the corresponding sequence start indicator bit 406 and the corresponding sequence end indicator bit 408 that the receiver may sample in order to extract the data sequence.

On the other hand, in response to a non-last segment (e.g., Segment 3) that does not include a data sequence, the transmitter (e.g., the encoder) may arrange the corresponding sequence end indicator bit 408 to be adjacent to the corresponding sequence start indicator bit 406. In this case, the N-bit sequence size indicator number 404 for the corresponding segment may be set to null (e.g., 0000-0000), such that the receiver may not expect any bits of a data sequence between the corresponding sequence start indicator bit 406 and the corresponding sequence end indicator bit 408 for the corresponding non-last segment. Accordingly, the encoded non-last segments may have the same number of bits as those of the corresponding segments in the data packet 400 prior to the encoding, and thus, overhead of the encoded data packet may be reduced or minimized.

As for the last segment (e.g., Segment 4), as discussed above, the last segment may not include any forbidden patterns therein, and thus, the last segment may be encoded by adding two position indicator bits to indicate that the segment is the last segment of the data packet. For example, as shown in FIG. 4B, the last segment (e.g., Segment 4) may be encoded by adding two last position indicator bits, in addition to any data sequence bits contained therein, if any, or if the last segment does not include any data sequence bits, the last segment may be encoded by including only the two last position indicator bits. For example, the last position indicator bits may include a last segment indicator bit 412 and a last segment sequence end indicator bit 418.

The last segment indicator bit 412 may enable the receiver to identify whether or not a corresponding encoded segment is the last segment. In other words, the last segment indicator bit 412 may have the opposite value of that of the non-last segment indicator bit 402 to inform the receiver whether the corresponding segment is a last segment or a non-last segment. For example, as shown in FIG. 4B, in some embodiments, in response to the last segment indicator bit 412 being set to true (e.g., a value of zero (0)), the receiver may identify the corresponding encoded segment as being the last segment. On the other hand, in response to the last segment indicator bit 412 being set to false (e.g., a value of one (1)), which may also be referred to as a non-last segment indicator bit 402 being set to true (e.g., a value of one (1)), the receiver may identify the corresponding encoded segment as not being the last segment. Thus, the last segment indicator bit 412 (or the non-last segment indicator bit 402) may inform (e.g., may signal) the receiver when a last segment of the encoded data packet is being transmitted (or has been received), such that the receiver may decode the last segment differently from the non-last segment. For example, as discussed above, because each of the non-last segments may include a forbidden pattern therein, and the last segment may not include a forbidden pattern therein, the last segment indicator bit 412 may inform the receiver that no forbidden patterns are to be appended at the end of the last segment.

The last segment sequence end indicator bit 418 may provide a guaranteed transition at the end of the encoded data packet. The last segment sequence end indicator bit 418 may be set as an invert of a last bit of the data sequence contained in the last segment, if any. In response to the last segment (e.g., Segment 4) including a data sequence (e.g., the fourth data sequence $S_4$), the transmitter (e.g., the encoder) may append the data sequence (e.g., the bits of the fourth data sequence $S_4$) between the last segment indicator bit 412 and the last segment sequence end indicator bit 418. Thus, the encoded last segment may have a size including all of the bits of the fourth data sequence $S_4$, plus one bit each for the last segment indicator bit 412 and the last segment sequence end indicator bit 418 (e.g., $S_4+2$).

On the other hand, in response to the last segment being an empty last segment (e.g., not containing any data sequences therein), the last segment sequence end indicator bit 418 may be set as an invert (e.g., one (1)) of the last segment indicator bit 412. In response to the last segment not including a data sequence, the transmitter (e.g., the encoder) may arrange the last segment sequence end indicator bit 418 to be adjacent to the last segment indicator bit 412. Thus, in this case, the encoded last segment may have a size corresponding to only one bit each for the last segment indicator bit 412 and the last segment sequence end indicator bit 418 (e.g., 2). Accordingly, the size of the encoded last segment may be equal to the size of a data sequence contained therein, if any, plus two (2) bits, one bit each for the last segment indicator bit 412 and the last segment sequence end indicator bit 418.

Unlike the non-last segments, the encoded last segment may not include the N-bit sequence size indicator number 404 or the sequence start indicator bit 406. For example, because the packet size P of the data packet 400 is fixed, the receiver may determine a size of any data sequence that may be contained in the encoded last segment according to the packet size P and the remaining bits of the data packet 400. For example, if the last segment (e.g., Segment 4) includes a data sequence (e.g., $S_4$), the receiver may determine a size (e.g., a bit size) of the data sequence (e.g., $S_4$) by counting a total number of bits that have been received (e.g., including the encoded bits of the non-last segment(s)), and subtracting that total number from the packet size P of the data packet 400. The resulting number is the size of the data sequence in the last segment, such that a size of the encoded last segment may be the resulting number plus 2 overhead bits (e.g., one each for the last segment indicator bit 412 and the last segment sequence end indicator bit 418). Accordingly, a total size of the encoded data packet may be equal to the packet size P of the data packet 400 plus 2 overhead bits for the encoded last segment of the data packet, regardless of any given limited run length K.

In some embodiments, an exception scenario may occur, for example, when the last segment includes a data sequence including (K−1) starting zeros (0). For example, if the limited run length K is equal to 10 bits, and the data sequence of the last segment starts with nine zeros (0), then a forbidden pattern may occur in the encoded data packet when the sequence end indicator bit 408 of an adjacent non-last segment has the value of zero (0). For example, in this case, because the last segment indicator bit 412 may also have the value of zero (0) to indicate that this is the last segment, the encoded segment would include 11 sequential bits all having the value of zero (0), which would correspond to a forbidden pattern.

In this case, as discussed in more detail below, in some embodiments, a maximum value of the N-bit sequence size indicator number 404 may be reserved as an exception indicator to inform the receiver that an exception occurred in the last segment, and the last segment may be encoded by replacing the (K−1) starting zeros (0) of the data sequence with one bit of the non-last segment indicator bit 402 set to true (e.g., a value of one (1)), the N-bit sequence size indicator number 404 set to the maximum value (e.g., 1111-1111) to indicate that this is an exception scenario of the last segment, one bit of a last sequence exception indicator bit set to true (e.g., a value of zero (0)), and one bit of the last segment sequence end indicator bit 418 set based on an invert of the last bit of the data sequence. The remaining bits of the data sequence may be arranged between the last sequence exception indicator bit and the last segment sequence end indicator bit 418, such that the resulting encoded last segment may still have a size of the data sequence plus two (2) bits. Accordingly, even in the exception scenario, a total size of the encoded data packet may be equal to the packet size P of the data packet 400 plus 2 overhead bits for the encoded last segment of the data packet, regardless of any given limited run length K.

Referring again to FIG. 3, the encoded segments may be transmitted at block 325, and the method 300 may end. For example, the transmitter may transmit the encoded segments to the receiver over the communication link or bus 106. In some embodiments, the transmitter may transmit the encoded segments serially (e.g., one bit at a time) to the receiver over the communication link or bus 106, but the present disclosure is not limited thereto.

Figure 5:
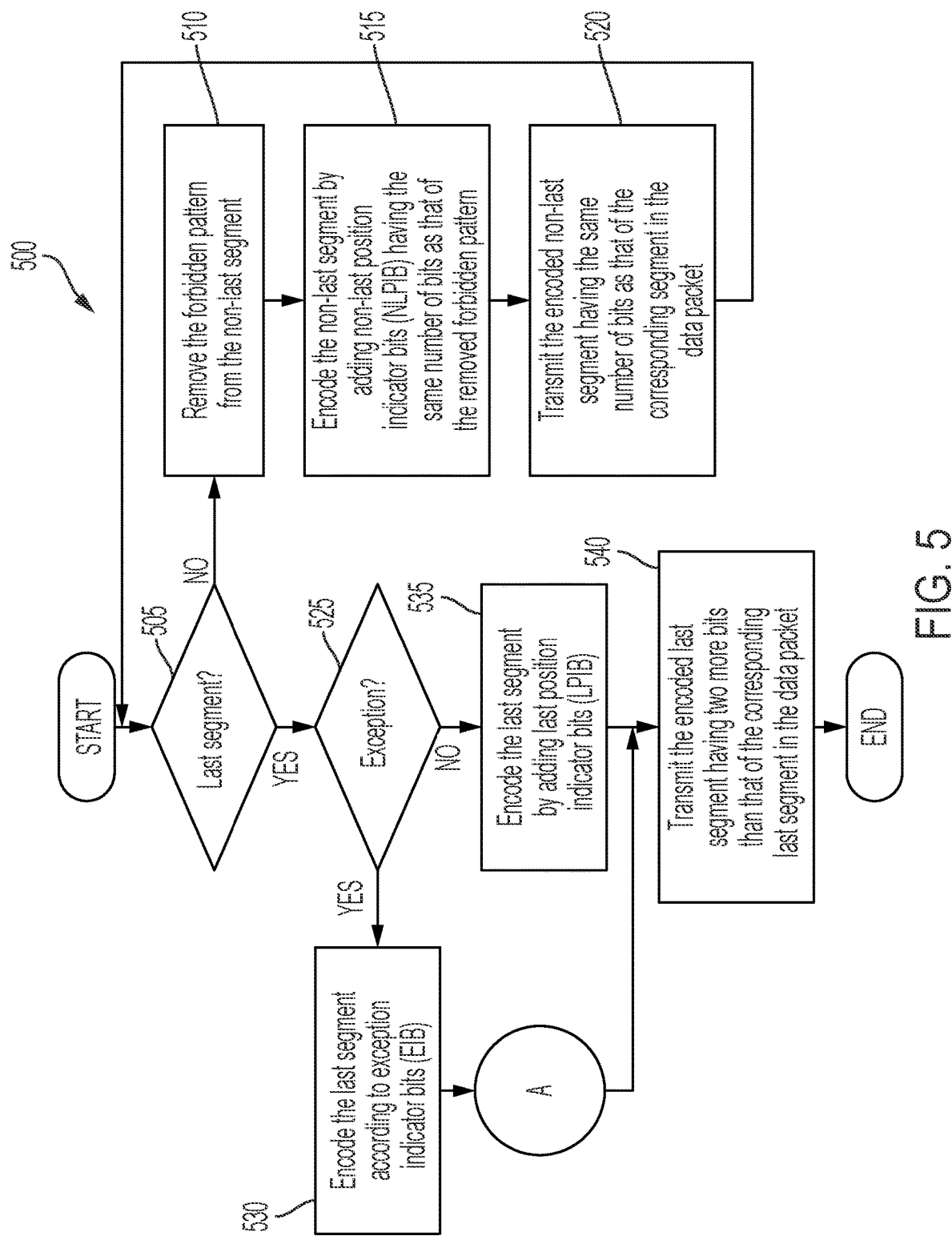
FIG. 5 is a flow diagram of a method for encoding segments of a data packet according to one or more embodiments of the present disclosure.
Figure 6:
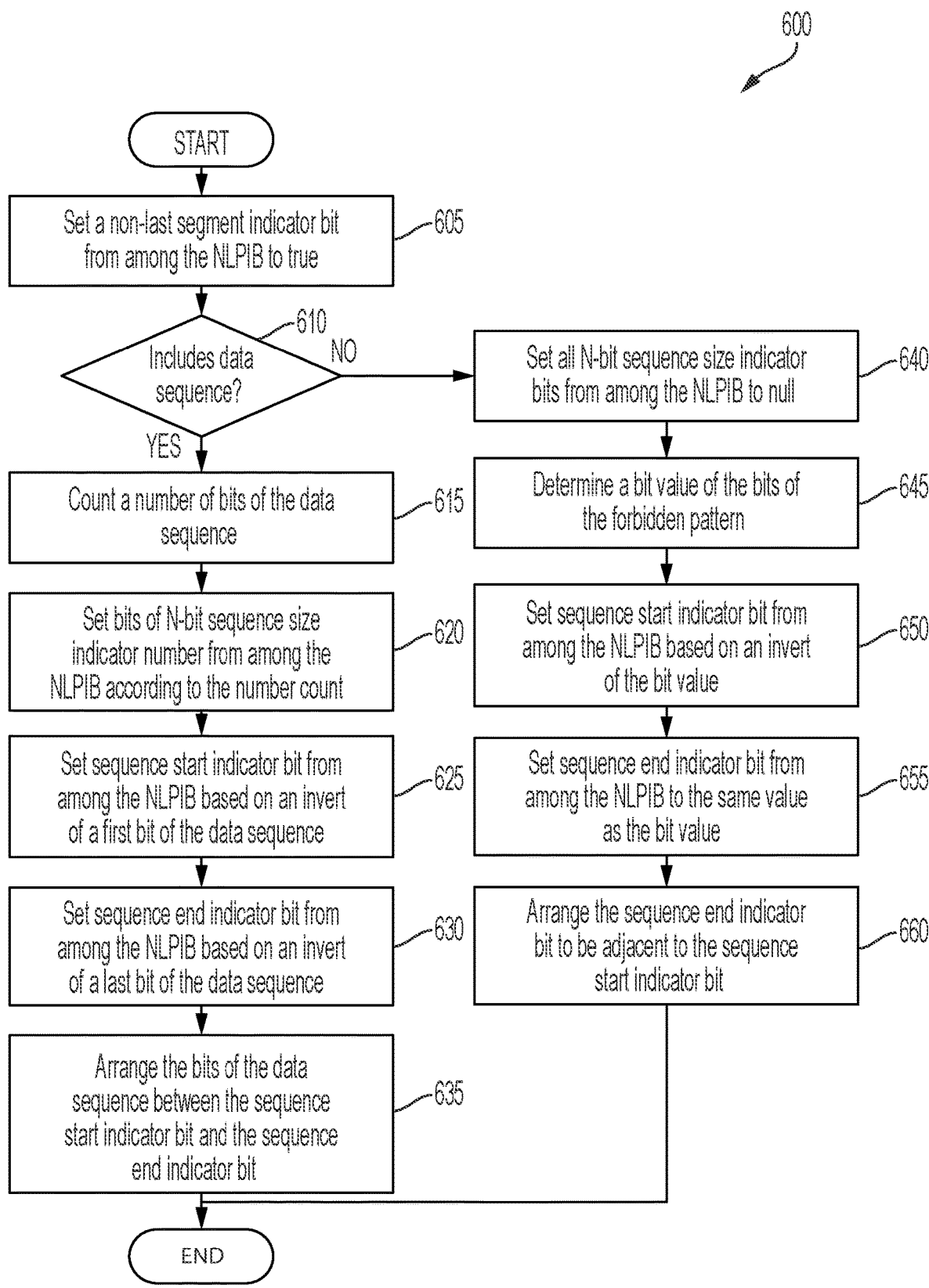
FIG. 6 is a flow diagram of a method for encoding a non-last segment according to one or more embodiments of the present disclosure.
Figure 7:
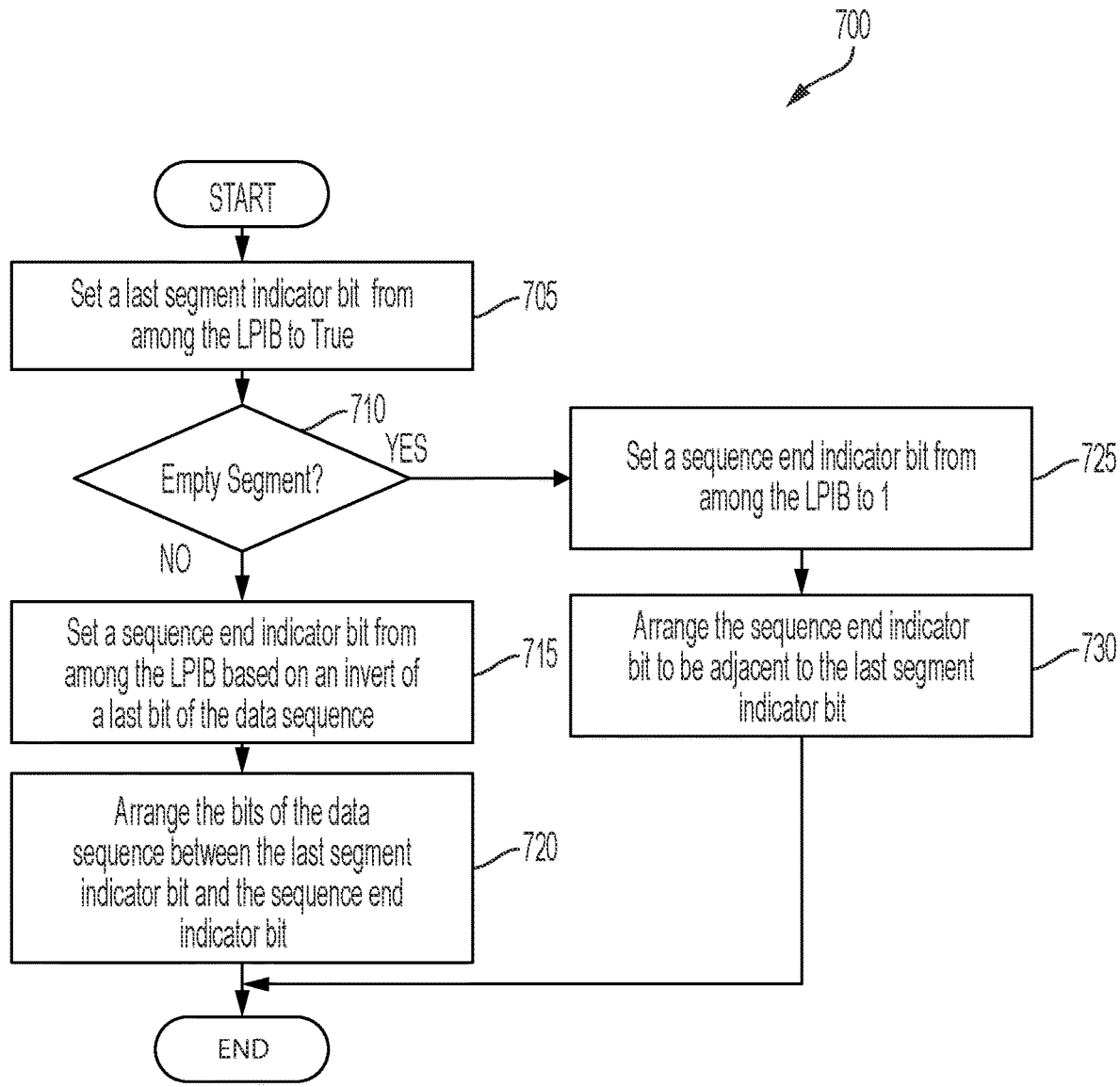
FIG. 7 is a flow diagram of a method for encoding a last segment according to one or more embodiments of the present disclosure.
Figure 8:
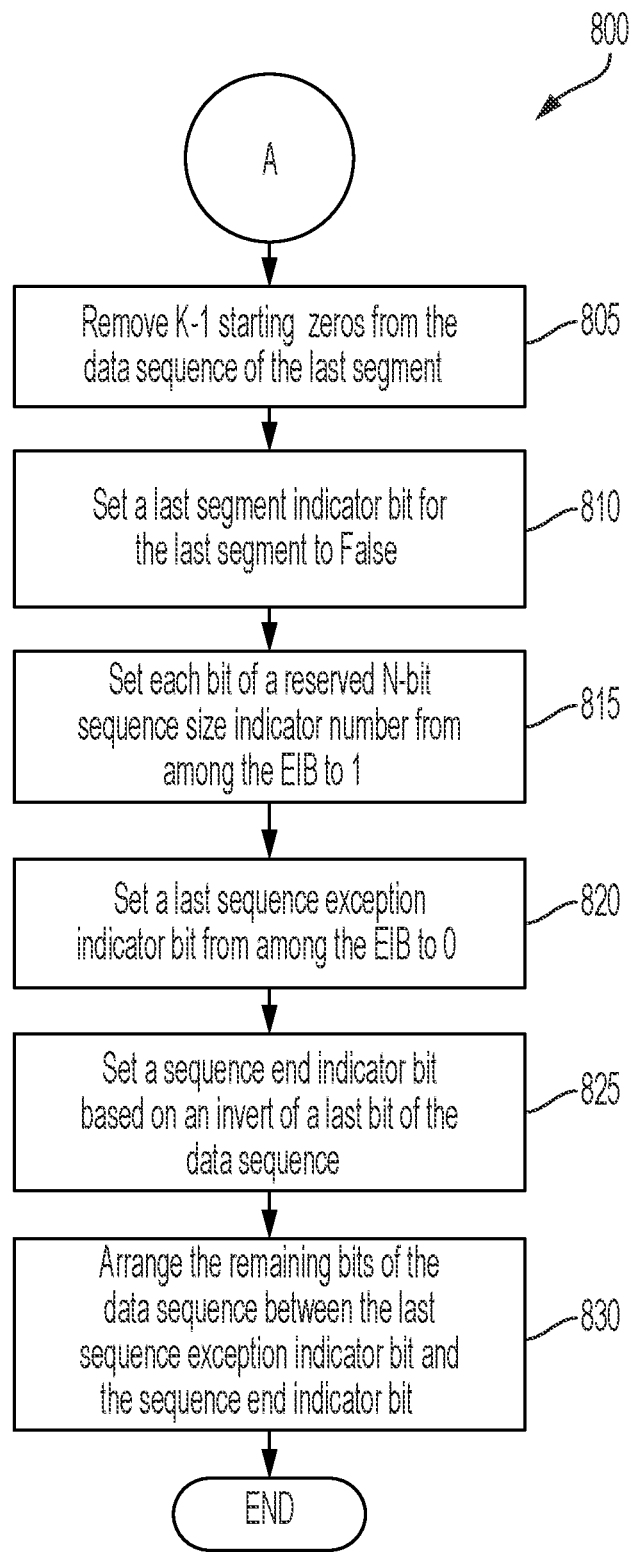
FIG. 8 is a flow diagram of a method for encoding a last segment including a data sequence having an exception scenario according to one or more embodiments of the present disclosure.

FIG. 5 is a flow diagram of a method for encoding segments of a data packet according to one or more embodiments of the present disclosure. FIG. 6 is a flow diagram of a method for encoding a non-last segment according to one or more embodiments of the present disclosure. FIG. 7 is a flow diagram of a method for encoding a last segment according to one or more embodiments of the present disclosure. FIG. 8 is a flow diagram of a method for encoding a last segment including a data sequence having an exception scenario according to one or more embodiments of the present disclosure.

For example, the methods 500, 600, 700, and 800 may be performed by the encoder shown in FIG. 1 to encode each of the segments at block 320 of the method 300 shown in FIG. 3. However, the present disclosure is not limited thereto, and the operations shown in the methods 500, 600, 700, and 800 may be performed by any suitable one of the components and elements or any suitable combination of the components and elements of those of one or more example embodiments described above. Further, the present disclosure is not limited to the sequence or number of the operations of the methods 500, 600, 700, and 800 shown in FIGS. 5, 6, 7, and 8, and can be altered into any desired sequence or number of operations as recognized by a person having ordinary skill in the art. For example, in some embodiments, the order may vary, or the methods 500, 600, 700, and 800 may include fewer or additional operations.

First, referring to FIG. 5, the method 500 may start, and to encode each of the segments at block 320 of the method 300 shown in FIG. 3, a determination may be made whether or not the segment is a last segment at block 505. For example, as discussed above, the data packet 400 may be segmented into a plurality of segments based on a location of one or more forbidden patterns contained in the data packet 400, such that a last segment thereof may not include any forbidden patterns, and the segments may be encoded differently according to whether or not the segment is the last segment.

In response to the segment not being a last segment (e.g., NO at block 505), a forbidden pattern may be removed from the non-last segment at block 510, and the non-last segment may be encoded by adding non-last position indicator bits (NLPIB) having the same number of bits as that of the removed forbidden pattern at block 515. For example, referring to FIGS. 4A and 4B, the NLPIB bits may include one bit corresponding to the non-last segment indicator bit 402, N-bits corresponding to the sequence size indicator number 404, one bit corresponding to the sequence start indicator bit 406, and one bit corresponding to the sequence end indicator bit 408. A number of the N-bits of the N-bit sequence size indicator number 404 may correspond to the number of bits (e.g., K+1) of the removed forbidden pattern, minus one bit for each of the non-last segment indicator bit 402, the sequence start indicator bit 406, and the sequence end indicator bit 408 (e.g., (K+1)−3). Accordingly, the NLPIB bits may include the same number of bits as that of the removed forbidden pattern.

To encode the non-last segment at block 515 of the method 500, referring to FIG. 6, the non-last segment indicator bit 402 may be set to true (e.g., one (1)) at block 605, and a determination may be made whether or not the non-last segment includes a data sequence at block 610. For example, as discussed above, each of the non-last segments may include at least a forbidden pattern, but may or may not further include a data sequence. Thus, in response to the non-last segment including a data sequence (e.g., YES at block 610), a number of bits of the data sequence may be counted at block 615, and the bits of the N-bit sequence size indicator number 404 may be set according to the bit count at block 620.

The sequence start indicator bit 406 may be set based on an invert of a first bit of the data sequence at block 625, and the sequence end indicator bit 408 may be set based on an invert of a last bit of the data sequence at block 630. The bits of the data sequence may be arranged between the sequence start indicator bit 406 and the sequence end indicator bit 408 at block 635, and the encoded non-last segment having the same number of bits as that of the corresponding segment in the data packet may be transmitted at block 520 of the method 500 of FIG. 5, such that the method 500 may be repeated until a last segment is determined at block 505.

In response to the non-last segment not including a data sequence (e.g., NO at block 610), or in other words, in response to the non-last segment beginning with a corresponding removed forbidden pattern such that the non-last segment is equal to the corresponding removed forbidden pattern, all the N-bit sequence size indicator number bits 404 may be set to null at block 640, and a bit value of the bits of the removed forbidden pattern may be determined at block 645. The sequence start indicator bit 406 may be set based on an invert of the bit value at block 650, and the sequence end indicator bit 408 may be set to the same value as that of the bit value at block 655. The sequence end indicator bit 408 may be arranged to be adjacent to the sequence start indicator bit 406 at block 660, and the encoded non-last segment having the same number of bits as that of the corresponding segment in the data packet may be transmitted at block 520 of the method 500 of FIG. 5, such that the method 500 may be repeated until a last segment is determined at block 505.

Referring again to FIG. 5, in response to the segment being the last segment (e.g., YES at block 505), a determination may be made whether or not the last segment includes an exception scenario at block 525. In response to the last segment including the exception scenario (e.g., YES at block 525), the last segment may be encoded according to exception indicator bits (EIB) at block 530, which will be described in more detail below with reference to FIG. 8. On the other hand, in response to the last segment not including the exception scenario (e.g., NO at block 525), the last segment may be encoded by adding last position indicator bits (LPIB) at block 535. For example, referring to FIGS. 4A and 4B, the LPIB bits may include the last segment indicator bit 412 and the last segment sequence end indicator bit 418. Accordingly, the LPIB bits may include two bits, one for each of the last segment indicator bit 412 and the last segment sequence end indicator bit 418.

To encode the last segment at block 535 of the method 500, referring to FIG. 7, the last segment indicator bit 412 may be set to true (e.g., zero (0)) at block 705, and a determination may be made whether or not the last segment is an empty segment at block 710. For example, as discussed above, while the last segment may not include a forbidden pattern, the last segment may or may not include a data sequence. Thus, when the last segment includes a data sequence, such that the last segment is not an empty segment (e.g., NO at block 710), the last segment sequence end indicator bit 418 may be set based on an invert of a last bit of the data sequence at block 715. The bits of the data sequence may be arranged between the last segment indicator bit 412 and the last segment sequence end indicator bit 418 at block 720, and the encoded last segment having two more bits than that of the corresponding last segment in the data packet may be transmitted at block 540 of the method 500 of FIG. 5, such that the method 500 may end.

In response to the last segment not including a data sequence, such that the last segment is an empty segment (e.g., YES at block 710), the last segment sequence end indicator bit 418 may be set to one (1) at block 725, which may be the invert of the value of the last segment indicator bit 412. The last segment sequence end indicator bit 418 may be arranged to be adjacent to the last segment indicator bit 412 at block 720, and the encoded last segment having two more bits than that of the corresponding last segment in the data packet may be transmitted at block 540 of the method 500 of FIG. 5, such that the method 500 may end.

Referring again to FIG. 5, in response to the last segment including an exception scenario (e.g., YES at block 525), the last segment may be encoded according to the exception indicator bits (EIB) at block 530. For example, as discussed above, in some embodiments, an exception scenario may occur when the last segment includes a data sequence including (K−1) starting zeros (0). In this case, the (K−1) starting zeros (0) of the data sequence may be replaced by the EIB bits having two (2) more bits than the replaced (K−1) starting zeros (0) of the data sequence. For example, the EIB bits may include one bit of the non-last segment indicator bit 402 set to true (e.g., a value of one (1)) (or one bit of the last segment indicator bit 412 set to false (e.g., a value of one (1)), a reserved N-bit sequence size indicator number 404 set to a maximum value (e.g., 1111-1111) to indicate that this is an exception scenario of the last segment, one bit of a last sequence exception indicator bit set to true (e.g., a value of zero (0)), and one bit of the last segment sequence end indicator bit 418 set based on an invert of the last bit of the data sequence.

To encode the last segment having the exception scenario at block 530 of the method 500, referring to FIG. 8, the (K−1) starting zeros (0) may be removed from the data sequence of the last segment at block 805. The last segment indicator bit 412 may be set to false (e.g., a value of one (1)) at block 810, and each bit of the reserved N-bit sequence size indicator number 404 may be set to 1 (e.g., 1111-1111) at block 815. Because the last segment indicator bit 412 is set to false (e.g., a value of one (1)), the receiver may treat the last segment as a non-last segment, such that the receiver may expect the N-bit sequence size indicator number 404 in order to determine a size of the data sequence. In this case, when the receiver inspects the reserved N-bit sequence size indicator number 404, the receiver may determine that the segment is a last-segment based on the maximum value (e.g., 1111-1111) of the reserved N-bit sequence size indicator number 404, and thus, may identify the segment as the last segment including the exception scenario.

The last sequence exception indicator bit may be set to zero (0) at block 820, and the last segment sequence end indicator bit 418 may be set based on an invert of a last bit of the data sequence at block 825. The remaining bits of the data sequence (e.g., the data sequence with the (K−1) starting zeros (0) removed therefrom) may be arranged between the last sequence exception indicator bit and the last segment sequence end indicator bit 418 at block 830, and the encoded last segment having two more bits than that of the corresponding last segment in the data packet may be transmitted at block 540 of the method 500 of FIG. 5, such that the method 500 may end.

According to one or more embodiments of the present disclosure, encoded non-last segments may have the same number of bits as that of the corresponding non-last segments in the data packet, and the encoded last segment may have 2 more overhead bits than that of the corresponding last segment in the data packet. Accordingly, irrespective of a size of the data packet, a size of a data sequence contained therein, or a size of a limited run length, only two (2)

overhead bits may be introduced in the encoded data packet, and thus, transmission rates thereof may be improved.

Figure 9A:
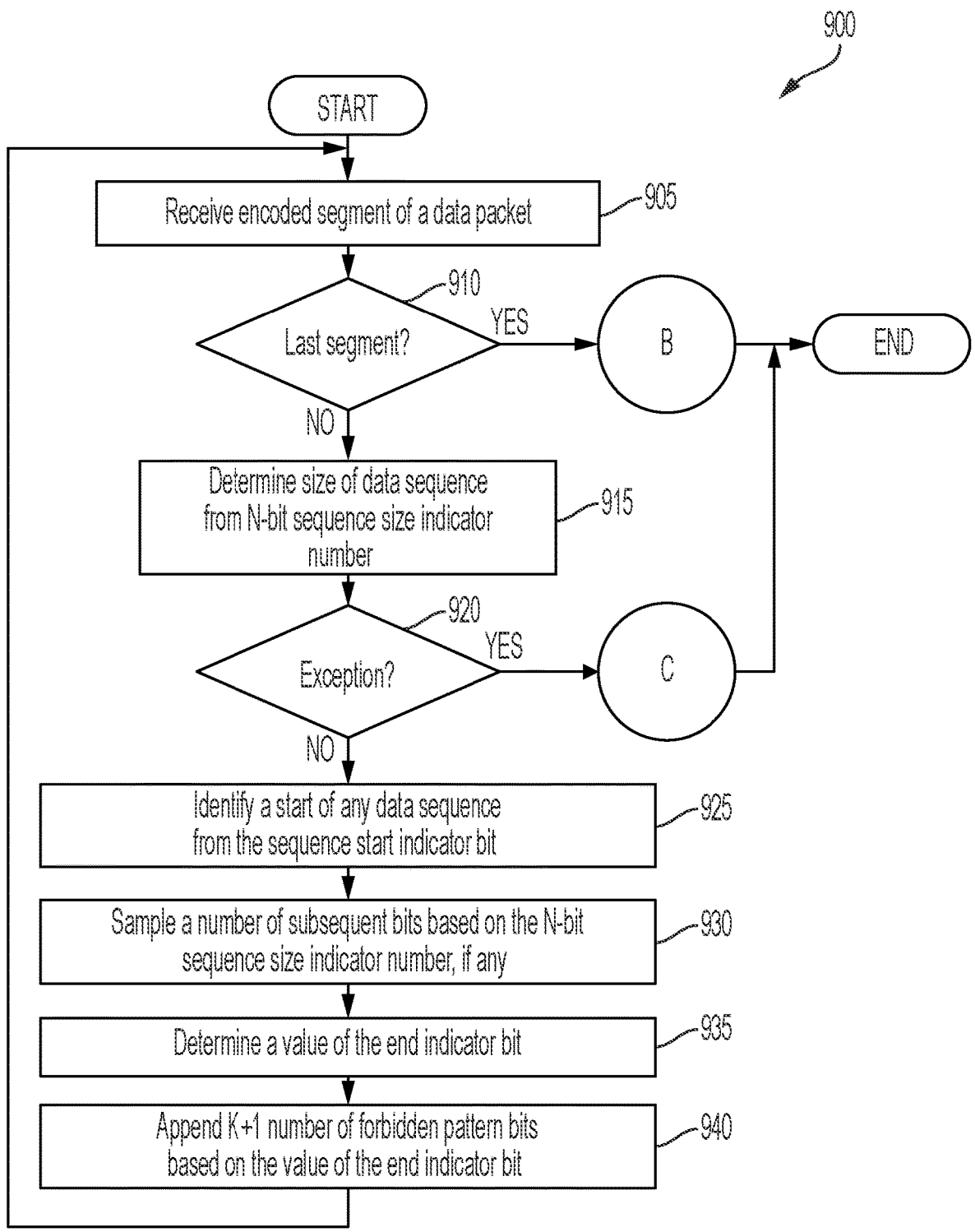
FIG. 9A is a flow diagram of a method of decoding an encoded data packet according to one or more embodiments of the present disclosure.
Figure 9B:
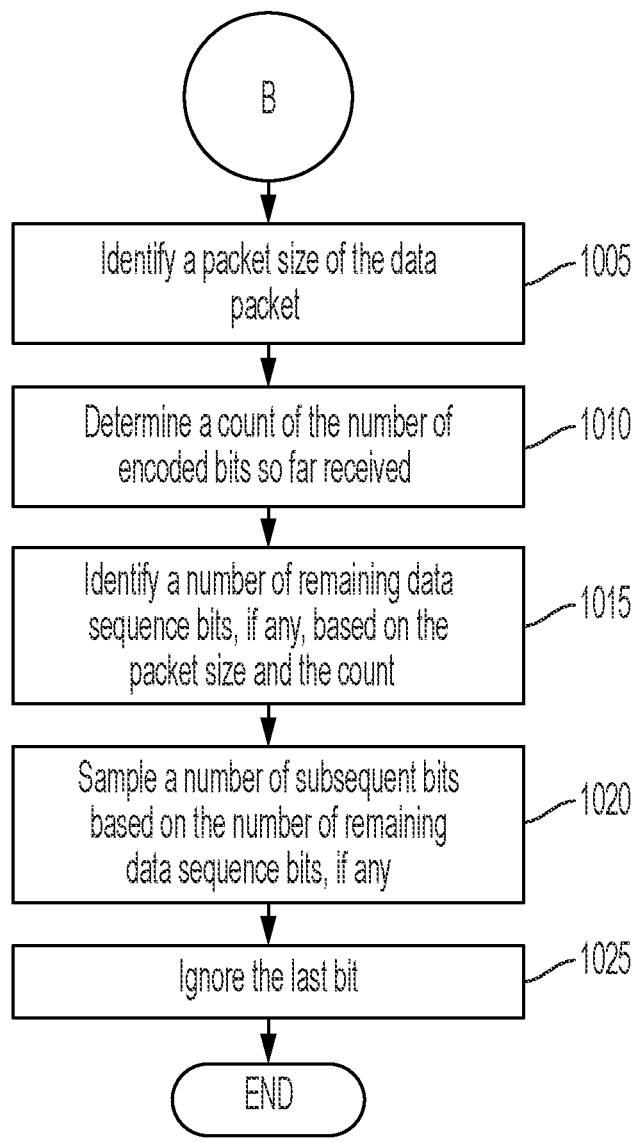
FIG. 9B is a flow diagram of a method of decoding a last encoded segment according to one or more embodiments of the present disclosure.
Figure 9C:
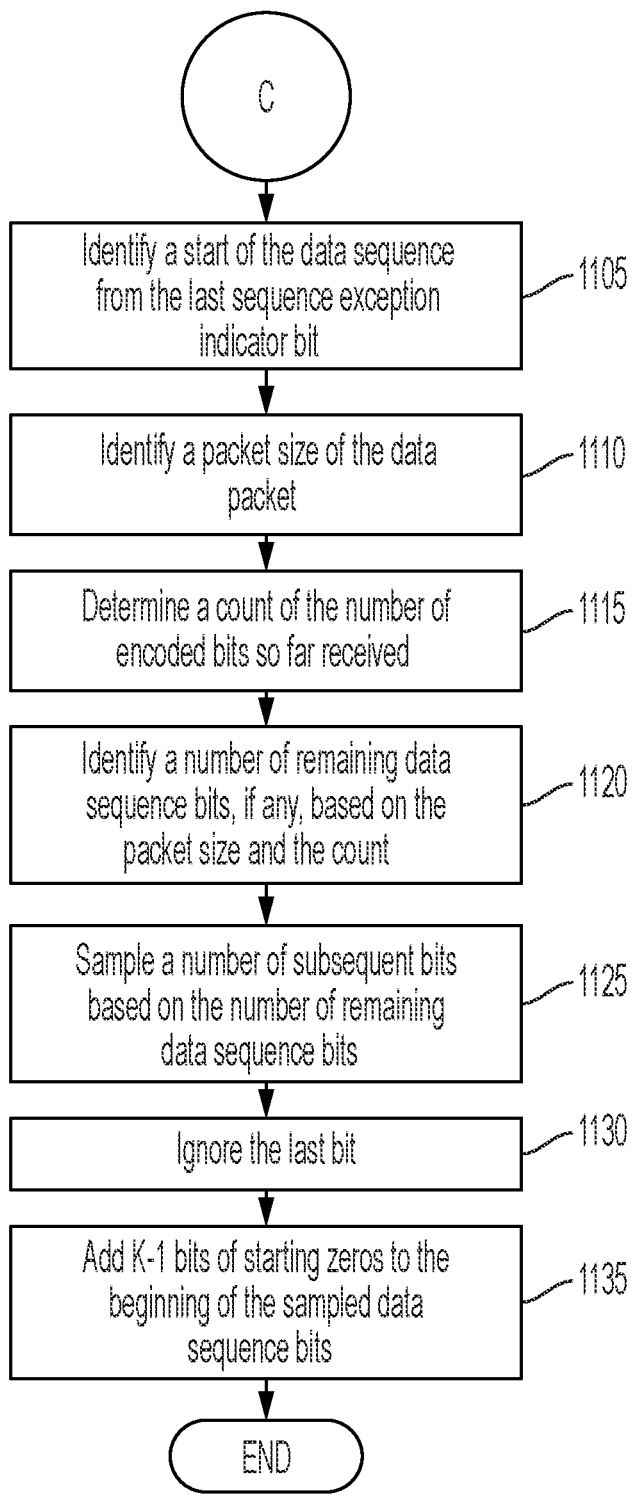
FIG. 9C is a flow diagram of a method of decoding a last encoded segment including a data sequence having an exception scenario according to one or more embodiments of the present disclosure.

FIG. 9A is a flow diagram of a method of decoding an encoded data packet according to one or more embodiments of the present disclosure. FIG. 9B is a flow diagram of a method of decoding a last encoded segment according to one or more embodiments of the present disclosure. FIG. 9C is a flow diagram of a method of decoding a last encoded segment including a data sequence having an exception scenario according to one or more embodiments of the present disclosure.

For example, the method 900 may be performed by the decoder shown in FIG. 1. However, the present disclosure is not limited thereto, and the operations shown in the method 900 may be performed by any suitable one of the components and elements or any suitable combination of the components and elements of those of one or more example embodiments described above. Further, the present disclosure is not limited to the sequence or number of the operations of the method 900 shown in FIGS. 9A to 9C, and can be altered into any desired sequence or number of operations as recognized by a person having ordinary skill in the art. For example, in some embodiments, the order may vary, or the method 900 may include fewer or additional operations.

First, referring to FIG. 9A, the method 900 may start, and an encoded segment of a data packet may be received at block 905. For example, in some embodiments, the encoded segment of the data packet may be received serially, one bit at a time, starting from a first bit (e.g., the non-last segment indicator bit 402 or the last segment indicator bit 412) of the encoded segment. A determination may be made as to whether or not the encoded segment is a last segment of the data packet at block 910. For example, the receiver may inspect a value of the first bit (e.g., the non-last segment indicator bit 402 or the last segment indicator bit 412) of the encoded segment to determine whether or not the encoded segment is the last segment. In this case, in response to the value of the first bit being set to a value (e.g., a value of zero (0)) indicating that the encoded segment is the last segment (e.g., YES at block 910), the method 900 may continue to block B, which will be described in more detail below with reference to FIG. 9B.

On the other hand, in response to the value of the first bit being set to a value (e.g., a value of one (1)) indicating that the encoded segment is not the last segment (e.g., NO at block 910), then a size of a data sequence may be determined from the N-bit sequence size indicator number at block 915. For example, when the value of the first bit indicates that the encoded segment is not the last segment, the receiver may expect the next (K−2) bits of the encoded segment to correspond to the N-bits for the N-bit sequence size indicator number 404. The receiver may inspect the N-bits to identify a binary representation of a number corresponding to the size of a data sequence, if any. Accordingly, the receiver may determine the size of any data sequence contained in the encoded segment based on the binary representation of the number from the next (K−2) bits corresponding to the N-bits received for the encoded segment.

A determination may be made as to whether or not the encoded segment includes an exception scenario at block 920. For example, as discussed above, in some embodiments, an exception scenario may occur when the last segment includes a data sequence including (K−1) starting zeros (0). Thus, as discussed above, in some embodiments, the receiver may determine whether or not an exception scenario occurs based on the N-bits received for the N-bit sequence size indicator number 404. For example, in response to the N-bit sequence size indicator number 404 representing a reserved value (e.g., a maximum value such as 1111-1111), the receiver may identify the encoded sequence as the last sequence, even though the first bit (e.g., the non-last segment indicator bit 402 or the last segment indicator bit 412) indicates otherwise.

Accordingly, in response to the N-bits of the N-bit sequence size indicator number 404 indicating the reserved value (e.g., YES at block 920), the method 900 may continue to block C, which will be described in more detail below with reference to FIG. 9C. On the other hand, in response to the N-bits of the N-bit sequence size indicator number 404 indicating a value different from the reserved value (e.g., NO at block 920), a start of any data sequence may be identified from the sequence start indicator bit at block 925. For example, after receiving the next (K−2) bits of the encoded segment corresponding to the N-bits for the N-bit sequence size indicator number 404, the receiver may expect the next bit to correspond to the sequence start indicator bit.

A number of subsequent bits after the sequence start indicator bit may be sampled, if any, based on the N-bit sequence size indicator number at block 930. For example, after receiving the sequence start indicator bit, the receiver may expect that a number of subsequent bits corresponding to the N-bit sequence size indicator number 404 are the data sequence bits of the encoded segment. When the N-bit sequence size indicator number represents zero (0) (e.g., 0000-0000), the receiver may expect no data sequence bits for the encoded segment after the sequence start indicator bit.

A value of the end indicator bit may be determined at block 935, and K+1 number of forbidden pattern bits may be appended based on the value of the end indicator bit at block 940. For example, after receiving a number of the data sequence bits corresponding to the N-bit sequence size indicator number 404 (which may be 0 bits), the receiver may expect the sequence end indicator bit as the last bit of the encoded data sequence. The receiver may determine a value of the sequence end indicator bit, and may append K+1 bits (e.g., to the end of the data sequence, if any, or as the decoded segment) to have the same value as that of the segment end indicator bit. The method 900 may then repeat until the last segment of the data packet is identified at block 910, or an exception scenario is identified for a last segment at block 920.

Referring to FIG. 9B, in response to the value of the first bit being set to a value (e.g., a value of zero (0)) indicating that the encoded segment is the last segment (e.g., YES at block 910), a packet size of the data packet may be identified at block 1005, and a count of the number of encoded bits so far received may be determined at block 1010. For example, as discussed above, while a size of each of the data sequences contained in the data packet may not be fixed, a packet size of the data packet may be fixed. Accordingly, even though the encoded last segment may not include the N-bit sequence size indicator number 404, the receiver may identify the size of the data sequence contained therein, if any, by simply counting the number of encoded bits thus received, and may subtract the number count from the packet size P of the data packet.

Accordingly, a number of the remaining data sequence bits, if any, may be identified at block 1015 based on the packet size P and the number count at block 1015, and a number of subsequent bits (e.g., after the first bit) may be sampled based on the number of remaining data sequence bits, if any, at block 1020. In this case, if the last segment is an empty segment, the receiver may determine that the last segment includes no data sequences therein based on the packet size P and the number count at block 1015. The last bit, which may correspond to the last segment sequence end indicator bit 418, may be ignored at block 1025, and the method 900 may end.

Referring to FIG. 9C, as discussed above, in some embodiments, the receiver may determine whether or not an exception scenario occurs based on the N-bits received for the N-bit sequence size indicator number 404. For example, in response to the N-bit sequence size indicator number 404 representing a reserved value (e.g., a maximum value such as 1111-1111) at block 910 of the method 900 shown in FIG. 9A, the receiver may identify the encoded sequence as the last sequence, even though the first bit (e.g., the non-last segment indicator bit 402 or the last segment indicator bit 412) indicates otherwise.

Accordingly, in response to the N-bits of the N-bit sequence size indicator number 404 at block 915 indicating the reserved value, such that the exception scenario occurs (e.g., YES at block 920), a start of the data sequence may be identified from the last sequence exception indicator bit at block 1105. For example, because the N-bits of the N-bit sequence size indicator number indicates the reserved value, the receiver may expect the last sequence exception indicator bit as the next bit after the N-bits of the N-bit sequence size indicator number 404 are received.

A packet size of the data packet may be identified at block 1110, and a count of the number of encoded bits so far received may be determined at block 1115. Even though the encoder removed the (K–1) starting zeros (0) of the data sequence in the encoded last segment, the receiver already knows that it should add (K–1) starting zeros (0) (because of the last segment indicator bit 412 and the N-bits of the N-bit sequence size indicator number 404 indicating the exception scenario). Accordingly, the number of remaining data sequence bits may already account for the (K–1) starting zeros (0) that were removed from the data sequence of the last segment.

Accordingly, a number of the remaining data sequence bits, if any, may be identified at block 1120 based on the packet size P and the number count at block 1115, and a number of subsequent bits (e.g., after the last sequence exception indicator bit) may be sampled based on the number of remaining data sequence bits, if any, at block 1125. The last bit, which may correspond to the last segment sequence end indicator bit 418, may be ignored at block 1130, K–1 bits of starting zeros may be added to the beginning of the sampled data sequence bits at block 1135, and the method 900 may end.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present disclosure.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A method of transition encoding comprising:
   receiving a data packet having a packet size;
   identifying one or more forbidden patterns in the data packet;
   segmenting the data packet into a plurality of segments based on a location of the one or more forbidden patterns in the data packet; and
   encoding the plurality of segments by removing the one or more forbidden patterns, and appending position indicator bits according to positions of the segments in the data packet,
   wherein a number of bits of an encoded non-last segment from among the plurality of segments plus the appended position indicator bits for the non-last segment is equal to a number of bits of the non-last segment before the encoding, and a number of bits of an encoded last segment from among the plurality of segments plus the appended position indicator bits for the last segment is equal to a number of bits of the last segment before the encoding plus two position indicator bits from among the appended position indicator bits.

2. The method of claim 1, wherein a forbidden pattern is a sequence of bits in the data packet that have the same value as each other.

3. The method of claim 2, wherein a number of bits in the sequence of bits is equal to a number of bits defined by a limited run-length plus one bit.

4. The method of claim 1, wherein the segmenting of the data packet comprises dividing the data packet into at least a first segment and a second segment according to a location of a last bit of a first forbidden pattern from among the one or more forbidden patterns in the data packet, the first segment corresponding to the non-last segment including at least all of the bits of the first forbidden pattern.

5. The method of claim 4, wherein the encoding of the plurality of segments comprises:
    removing all of the bits of the first forbidden pattern from the first segment; and
    appending the position indicator bits having the same number of bits as that of the removed bits of the first forbidden pattern.

6. The method of claim 5, wherein the position indicator bits comprise one non-last segment indicator bit, an N-bit sequence size indicator number, one sequence start indicator bit, and one sequence end indicator bit, where N is equal to a number of the removed bits of the first forbidden pattern minus 3.

7. The method of claim 6, wherein the first segment begins with the first forbidden pattern and is equal to the first forbidden pattern, and the encoding of the plurality of segments further comprises:
    setting each bit of the N-bit sequence size indicator number to null;
    setting the one sequence start indicator bit to an invert of a value of a removed bit of the first forbidden pattern;
    setting the one sequence end indicator bit to the value of the removed bit; and
    arranging the one sequence end indicator bit to be adjacent to the one sequence start indicator bit in the encoded first segment.

8. The method of claim 6, wherein the first segment further comprises a first data sequence, and the encoding of the plurality of segments further comprises:
    counting a number of bits of the first data sequence;
    setting the N-bit sequence size indicator number to the number count;
    setting the one sequence start indicator bit to an invert of a value of a first bit of the first data sequence;
    setting the one sequence end indicator bit to an invert of a value of a last bit of the first data sequence; and
    adding the first data sequence between the one sequence start indicator bit and the one sequence end indicator bit in the encoded first segment.

9. The method of claim 4, wherein the second segment corresponds to the last segment having no forbidden patterns and no data sequence, and the encoding of the plurality of segments comprises:
    adding the two position indicator bits to the second segment to encode the second segment, the two position indicator bits comprising one last segment indicator bit and one sequence end indicator bit;
    setting the one sequence end indicator bit based on an invert of the one last segment indicator bit; and
    arranging the one sequence end indicator bit to be adjacent to the last segment indicator bit in the encoded second segment.

10. The method of claim 4, wherein the second segment corresponds to the last segment having a second data sequence and no forbidden patterns, and the encoding of the plurality of segments comprises:
    adding the two position indicator bits to the second segment to encode the second segment, the two position indicator bits comprising one last segment indicator bit and one sequence end indicator bit;
    setting the one sequence end indicator bit based on an invert of a last bit of the second data sequence; and
    arranging the second data sequence between the one last segment indicator bit and the one sequence end indicator bit in the encoded second segment.

11. A data transmission system comprising:
    a communication link; and
    a transmitter communicably connected to the communication link, the transmitter comprising an encoder configured to:
        receive a data packet having a packet size;
        identify one or more forbidden patterns in the data packet;
        segment the data packet into a plurality of segments based on a location of the one or more forbidden patterns in the data packet;
        encode the plurality of segments by removing the one or more forbidden patterns, and appending position indicator bits according to positions of the segments in the data packet; and
        transmit the encoded segments over the communication link,
    wherein a number of bits of an encoded non-last segment from among the plurality of segments plus the appended position indicator bits for the non-last segment is equal to a number of bits of the non-last segment before the encoding, and a number of bits of an encoded last segment from among the plurality of segments plus the appended position indicator bits for the last segment is equal to a number of bits of the last segment before the encoding plus two position indicator bits from among the appended position indicator bits.

12. The system of claim 11, wherein the plurality of segments comprises at least a first segment and a second segment divided according to a location of a last bit of a first forbidden pattern from among the one or more forbidden patterns in the data packet, the first segment corresponding to the non-last segment including at least all of the bits of the first forbidden pattern.

13. The system of claim 12, wherein to encode the plurality of segments, the encoder is further configured to:
    remove all of the bits of the first forbidden pattern from the first segment; and
    append the position indicator bits having the same number of bits as that of the removed bits of the first forbidden pattern.

14. The system of claim 13, wherein the position indicator bits comprise one non-last segment indicator bit, an N-bit sequence size indicator number, one sequence start indicator bit, and one sequence end indicator bit, where N is equal to a number of the removed bits of the first forbidden pattern minus 3.

15. The system of claim 14, wherein the first segment begins with the first forbidden pattern and is equal to the first forbidden pattern, and to encode the plurality of segments, the encoder is further configured to:
    set each bit of the N-bit sequence size indicator number to null;
    set the one sequence start indicator bit to an invert of a value of a removed bit of the first forbidden pattern;
    set the one sequence end indicator bit to the value of the removed bit; and
    arrange the one sequence end indicator bit to be adjacent to the one sequence start indicator bit in the encoded first segment.

16. The system of claim 14, wherein the first segment further comprises a first data sequence, and to encode the plurality of segments, the encoder is further configured to:

count a number of bits of the first data sequence;
set the N-bit sequence size indicator number to the number count;
set the one sequence start indicator bit to an invert of a value of a first bit of the first data sequence;
set the one sequence end indicator bit to an invert of a value of a last bit of the first data sequence; and
add the first data sequence between the one sequence start indicator bit and the one sequence end indicator bit in the encoded first segment.

17. The system of claim 12, wherein the second segment corresponds to the last segment having no forbidden patterns and no data sequence, and to encode the plurality of segments, the encoder is further configured to:
add the two position indicator bits to the second segment to encode the second segment, the two position indicator bits comprising one last segment indicator bit and one sequence end indicator bit;
set the one sequence end indicator bit based on an invert of the one last segment indicator bit; and
arrange the one sequence end indicator bit to be adjacent to the last segment indicator bit in the encoded second segment.

18. The system of claim 12, wherein the second segment corresponds to the last segment having a second data sequence and no forbidden patterns, and to encode the plurality of segments, the encoder is further configured to:
add the two position indicator bits to the second segment to encode the second segment, the two position indicator bits comprising one last segment indicator bit and one sequence end indicator bit;
set the one sequence end indicator bit based on an invert of a last bit of the second data sequence; and
arrange the second data sequence between the one last segment indicator bit and the one sequence end indicator bit in the encoded second segment.

19. The system of claim 11, further comprising a receiver communicably connected to the communication link, the receiver comprising a decoder configured to:
receive a first bit of an encoded segment of the data packet over the communication link, the first bit corresponding to a non-last segment indicator bit of the encoded segment;
determine that a bit value of the first bit indicates that the encoded segment is not the last segment of the data packet;
receive a last bit of the encoded segment over the communication link, the last bit corresponding to a sequence end indicator bit of the encoded segment;
determine a bit value of the last bit; and
decode the encoded segment by appending a number of sequential bits having the same value as that of the last bit of the encoded segment, the number of sequential bits being equal to a number of bits defined by a limited run-length plus one bit.

20. A method for decoding comprising:
receiving a first bit of an encoded segment of a data packet, the first bit corresponding to a non-last segment indicator bit of the encoded segment;
determining that a bit value of the first bit indicates that the encoded segment is not a last segment of the data packet;
receiving a last bit of the encoded segment, the last bit corresponding to a sequence end indicator bit of the encoded segment;
determining a bit value of the last bit; and
decoding the encoded segment by appending a number of sequential bits having the same value as that of the last bit of the encoded segment, the number of sequential bits being equal to a number of bits defined by a limited run-length plus one bit,
wherein a number of bits of an encoded non-last segment plus appended position indicator bits for the non-last segment is equal to a number of bits of the non-last segment before encoding, and a number of bits of an encoded last segment plus appended position indicator bits for the last segment is equal to a number of bits of the last segment before the encoding plus two appended position indicator bits.

* * * * *